US009772366B2

(12) United States Patent
Chou et al.

(10) Patent No.: US 9,772,366 B2
(45) Date of Patent: Sep. 26, 2017

(54) CIRCUITS AND METHODS OF TESTING A DEVICE UNDER TEST USING THE SAME

(71) Applicant: Taiwan Semiconductor Manufacturing Company Limited, Hsinchu (TW)

(72) Inventors: Shuo-Chun Chou, Hsinchu (TW); Chi-Feng Huang, Hsinchu County (TW); Chia-Chung Chen, Keelung (TW); Victor Chiang Liang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 183 days.

(21) Appl. No.: 14/632,001

(22) Filed: Feb. 26, 2015

(65) Prior Publication Data
US 2016/0252558 A1    Sep. 1, 2016

(51) Int. Cl.
G01R 31/26 (2014.01)
G01R 31/02 (2006.01)
G01R 31/28 (2006.01)
H01L 21/66 (2006.01)

(52) U.S. Cl.
CPC ....... *G01R 31/028* (2013.01); *G01R 31/2856* (2013.01); *H01L 22/00* (2013.01)

(58) Field of Classification Search
CPC  G01R 31/26; G01R 31/2642; G01R 31/2648; G01R 31/2831; G01R 31/31702
See application file for complete search history.

(56) References Cited

U.S. PATENT DOCUMENTS

| | | | | | |
|---|---|---|---|---|---|
| 5,357,468 | A | * | 10/1994 | Satani | G11C 11/4091 365/189.07 |
| 5,548,211 | A | * | 8/1996 | Tujide | G01R 31/305 324/754.22 |
| 7,301,359 | B2 | * | 11/2007 | Furukawa | G01R 31/3008 324/750.03 |
| 7,994,811 | B2 | * | 8/2011 | Lee | G01R 31/2884 324/500 |
| 8,106,675 | B2 | * | 1/2012 | Song | G01R 31/31926 324/762.01 |
| 2006/0152242 | A1 | * | 7/2006 | Lee | G01R 31/31926 324/754.03 |
| 2007/0200587 | A1 | * | 8/2007 | Doong | G01R 31/31723 324/762.01 |

(Continued)

*Primary Examiner* — Tung X Nguyen
*Assistant Examiner* — Dominic Hawkins
(74) *Attorney, Agent, or Firm* — Jones Day

(57) ABSTRACT

A method of testing a device under test (DUT) connected between first and second DUT nodes includes generating a set of control signals, and in response to the set of control signals, disconnecting a first voltage node from a first DUT node, connecting a second voltage node to the first DUT node, periodically connecting and disconnecting a third voltage node to and from the second DUT node at a predetermined frequency, disconnecting a fourth voltage node from the second DUT node when the third voltage node is connected to the second DUT node, and connecting the fourth voltage node to the second DUT node when the third voltage node is disconnected from the second DUT node. A circuit that performs the method is also disclosed.

20 Claims, 12 Drawing Sheets

(56) References Cited

U.S. PATENT DOCUMENTS

| | | | |
|---|---|---|---|
| 2008/0068029 A1* | 3/2008 | Tanida | G01R 27/2605 |
| | | | 324/658 |
| 2010/0327638 A1* | 12/2010 | Petereit | B60N 2/002 |
| | | | 297/180.12 |
| 2011/0050272 A1* | 3/2011 | Kimura | G01R 31/2621 |
| | | | 324/762.02 |
| 2016/0139180 A1* | 5/2016 | Meninger | G01R 1/20 |
| | | | 324/756.01 |

* cited by examiner

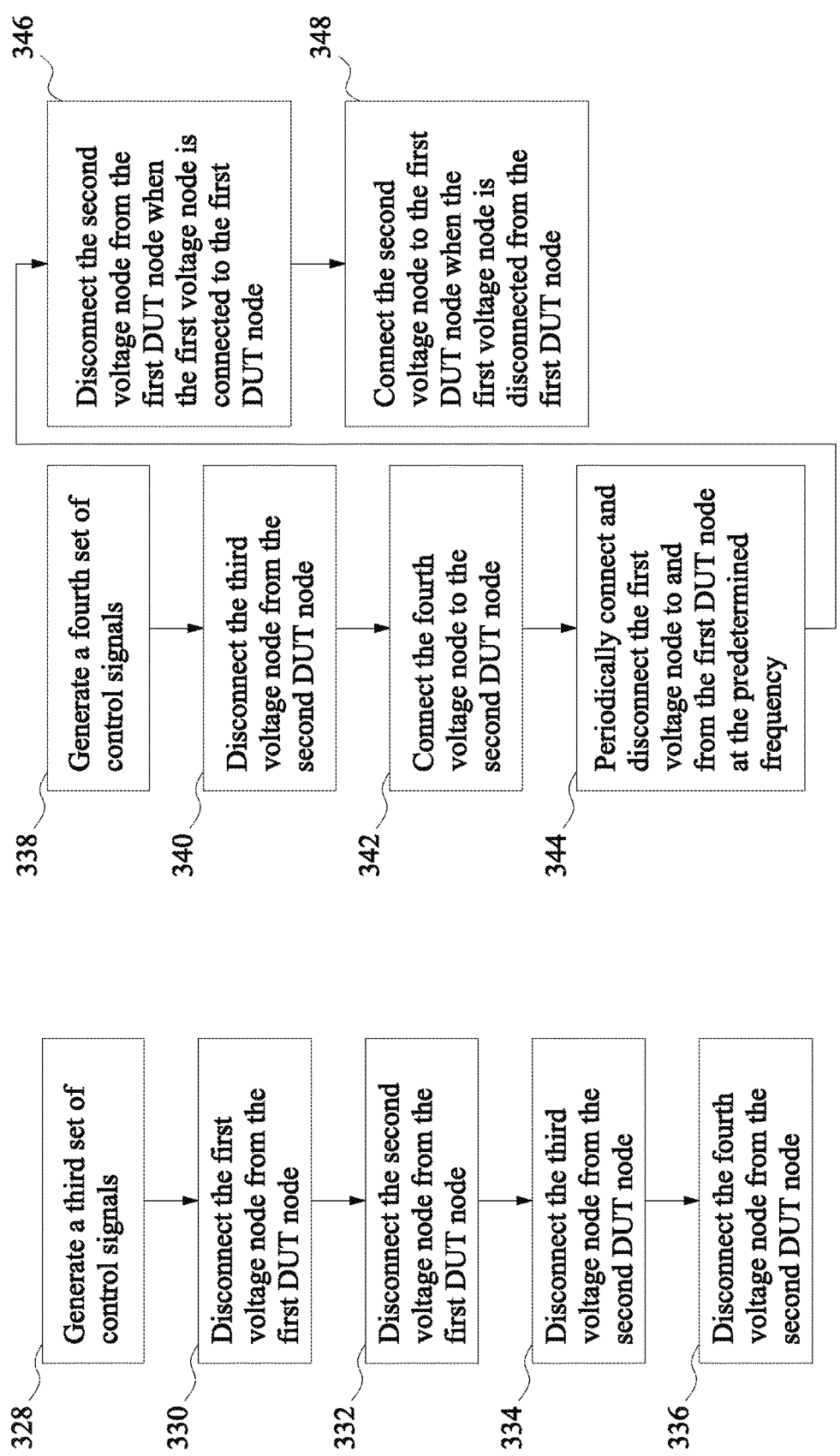

CIRCUITS AND METHODS OF TESTING A DEVICE UNDER TEST USING THE SAME

BACKGROUND

In semiconductor fabrication, after forming a device, e.g., a capacitor, a wafer acceptance tester (WAT) is used to measure a capacitance of the capacitor. The WAT introduces parasitic capacitances when measuring and is therefore not suitable for small capacitance measurement, e.g., capacitances in the femto-farad (FF) range.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are flowcharts of an exemplary method of testing a device under test (DUT) in accordance with some embodiments.

DETAILED DESCRIPTION

Figure 2:
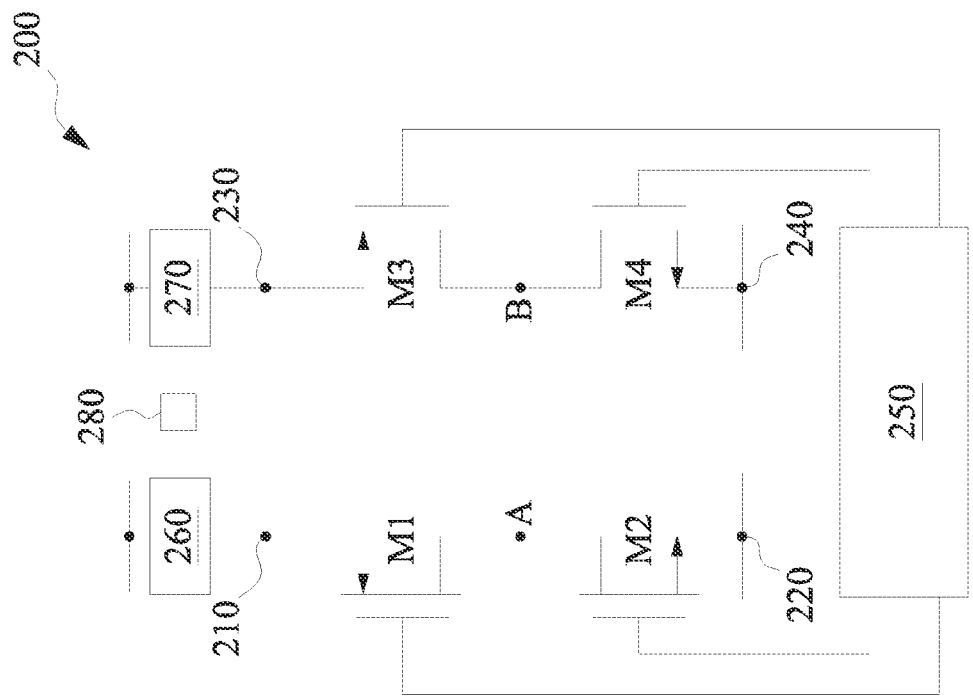
FIG. 2 is a schematic diagram of another exemplary circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
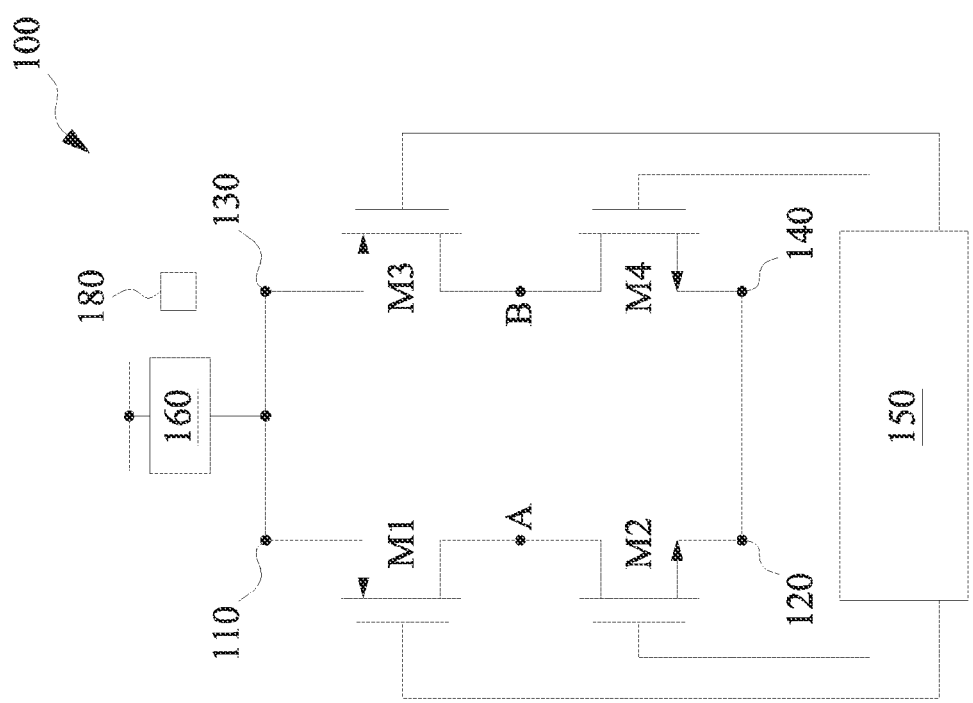
FIG. 1 is a schematic diagram of an exemplary circuit in accordance with some embodiments.

The present disclosure provides a charge-based capacitance measurement (CBCM) circuit, e.g., the circuit 100 shown in FIG. 1, configured to measure a device under test (DUT) having a capacitance that does not vary with, i.e., independent of, voltage, and another CBCM circuit, e.g., the circuit 200 shown in FIG. 2, configured to measure both a DUT having a voltage-independent capacitance and a DUT having a voltage-dependent capacitance. Each of the circuits includes two pairs of transistors, gate terminals of which are free from connection with each other. The construction as such, as will be evident, permits the transistors of the circuits to be controlled individually and the circuits to measure small capacitances with high degree of accuracy.

FIG. 1 is a schematic diagram of an exemplary circuit 100 in accordance with some embodiments. As illustrated in FIG. 1, the circuit 100 includes a pair of DUT nodes (A, B), two pairs of voltage nodes 110, 120, 130, 140, two pairs of transistors (M1, M2, M3, M4), a control unit 150, a current-measuring unit 160, and a calculating unit 180.

In this exemplary embodiment, each of the transistors (M1, M3) is a PMOS transistor, and includes a source terminal, a drain terminal, and a gate terminal. The source terminal of each of the transistors (M1, M3) is connected to a respective one of the voltage nodes 110, 130. The drain terminal of each of the transistors (M1, M3) is connected to a respective one of the DUT nodes (A, B). In this exemplary embodiment, each of the transistors (M2, M4) is an NMOS transistor, and includes a source terminal, a drain terminal, and a gate terminal. The source terminal of each of the transistors (M2, M4) is connected to a respective one of the voltage nodes 120, 140. The drain terminal of each of the transistors (M2, M4) is connected to the respective one of the DUT nodes (A, B). In this exemplary embodiment, the gate terminals of the transistors (M1, M2, M3, M4) are free from connection with each other, i.e., the gate terminals of the transistors (M1, M2, M3, M4) are not connected directly to each other. In some embodiments, at least one of the transistors (M1, M3) is an NMOS transistor. In some embodiments, at least one of the transistors (M2, M4) is a PMOS transistor.

The control unit 150, e.g., a signal generator, includes two pairs of ports, each of which is connected to the gate terminal of a respective one of the transistors (M1, M2, M3, M4), and is configured to control operations of the transistors (M1, M2, M3, M4). In this exemplary embodiment, the control unit 150 is operable to generate a plurality of sets of control signals. Each of the control signals in a set is output through a respective one of the ports, whereby the control unit 150 controls operations of the transistors (M1, M2, M3, M4).

The current-measuring unit 160, e.g., an ammeter, is connected to the first and third voltage nodes 110, 130 and is configured to measure a current flowing therethrough.

The calculating unit 180, e.g., a microprocessor, is connected to the current-measuring unit 160 and is configured to calculate a capacitance of a DUT (not shown) connected between the DUT nodes (A, B), which is described further below in the context of an exemplary method of measuring a capacitance of a DUT using the circuit 100.

FIG. 2 is a schematic diagram of another exemplary circuit 200 in accordance with some embodiments. As illustrated in FIG. 2, the circuit 200 includes a pair of DUT nodes (A, B), two pairs of voltage nodes 210, 220, 230, 240, two pairs of transistors (M1, M2, M3, M4), a control unit 250, a pair of current-measuring units 260, 270, and a calculating unit 280.

The voltage nodes 210, 220, 230, 240 are free from connection with each other, i.e., the voltage nodes 210, 220, 230, 240 are not connected directly to each other. In this exemplary embodiment, each of the transistors (M1, M3) is a PMOS transistor, and includes a source terminal, a drain terminal, and a gate terminal. The source terminal of each of the transistors (M1, M3) is connected to a respective one of the voltage nodes 210, 230. The drain terminal of each of the transistors (M1, M3) is connected to a respective one of the DUT nodes (A, B). In this exemplary embodiment, each of the transistors (M2, M4) is an NMOS transistor, and includes a source terminal, a drain terminal, and a gate terminal. The drain terminal of each of the transistors (M2, M4) is connected to the respective one of the DUT nodes (A, B). The source terminal of each of the transistors (M2, M4) is connected to a respective one of the voltage nodes 220, 240. In this exemplary embodiment, the gate terminals of the transistors (M1, M2, M3, M4) are free from connection with each other, i.e., the gate terminals of the transistors (M1, M2, M3, M4) are not connected directly to each other. In some embodiments, at least one of the transistors (M1, M3) is an NMOS transistor. In some embodiments, at least one of the transistors (M2, M4) is a PMOS transistor.

The control unit 250 includes two pairs of ports, each of which is connected to the gate terminal of a respective one of the transistors (M1, M2, M3, M4), and is configured to control operations of the transistors (M1, M2, M3, M4). In this exemplary embodiment, the control unit 250 is operable to generate a plurality of sets of control signals. Each of the control signals in a set is output through a respective one of the ports thereof, whereby the control unit 150 controls operations of the transistors (M1, M2, M3, M4).

Each of the current-measuring units 260, 270 is connected to a respective one of the first and third voltage nodes 210, 230 and is configured to measure a current flowing therethrough.

The calculating unit 280 is connected to the current-measuring units 260, 270 and is configured to calculate a capacitance of a DUT (not shown) connected between the DUT nodes (A, B), which is described further below in the context of an exemplary method of measuring a capacitance a DUT using the circuit 200.

Figure 3A:
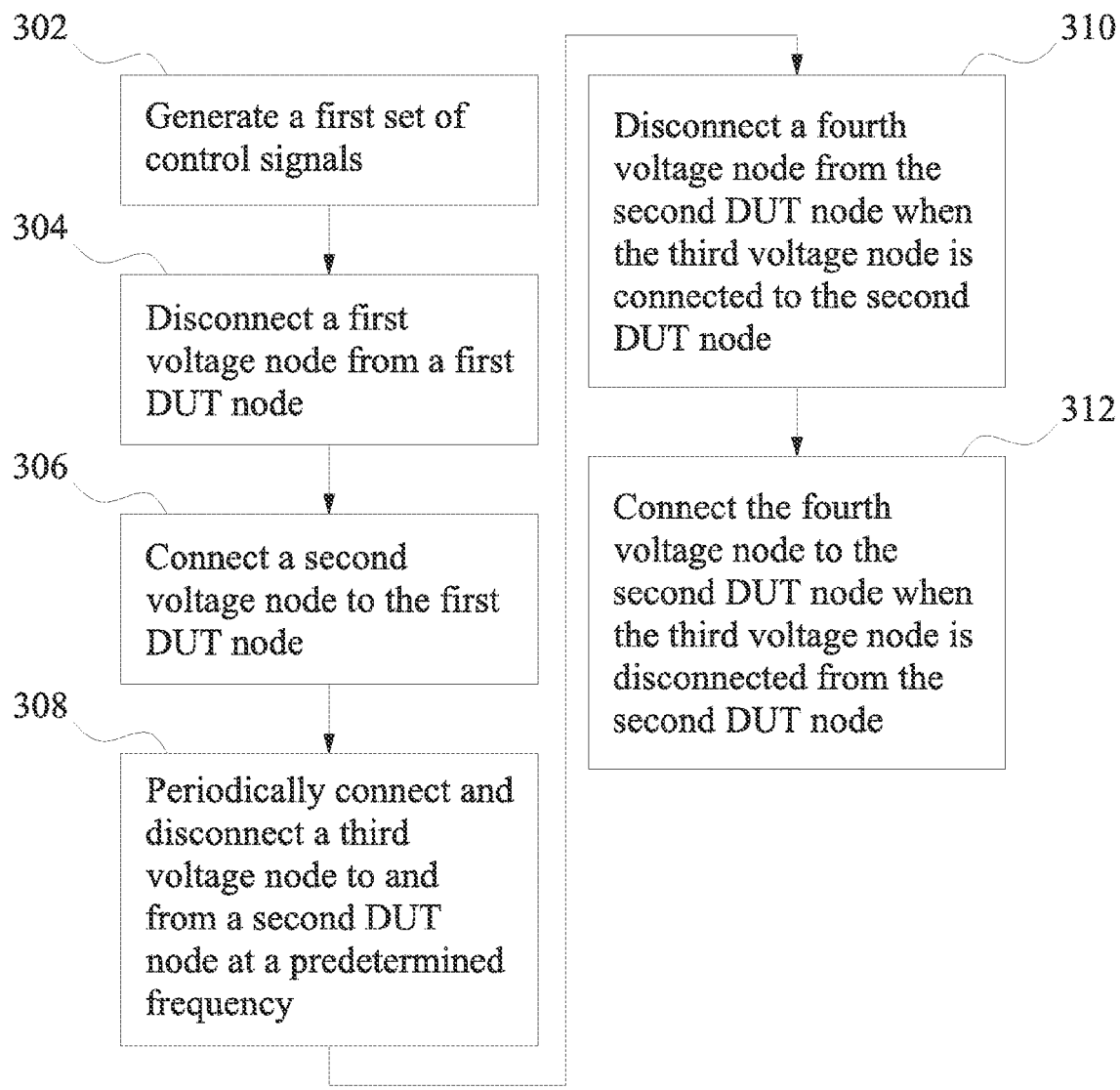

FIGS. 3A-3D are flowcharts of an exemplary method of testing a DUT connected between first and second DUT nodes in accordance with some embodiments. As illustrated in FIG. 3A, a circuit generates a first set of control signals (operation 302), and in response to the first set of control signals: the circuit disconnects a first voltage node from the first DUT node (operation 304); the circuit connects a second voltage node to the first DUT node (operation 306); the circuit periodically connects and disconnects a third voltage node to and from the second DUT node at a predetermined frequency (operation 308); the circuit disconnects a fourth voltage node from the second DUT node when the third voltage node is connected to the second DUT node (operation 310); and the circuit connects the fourth voltage node to the second DUT node when the third voltage node is disconnected from the second DUT node (operation 312).

Figure 3B:
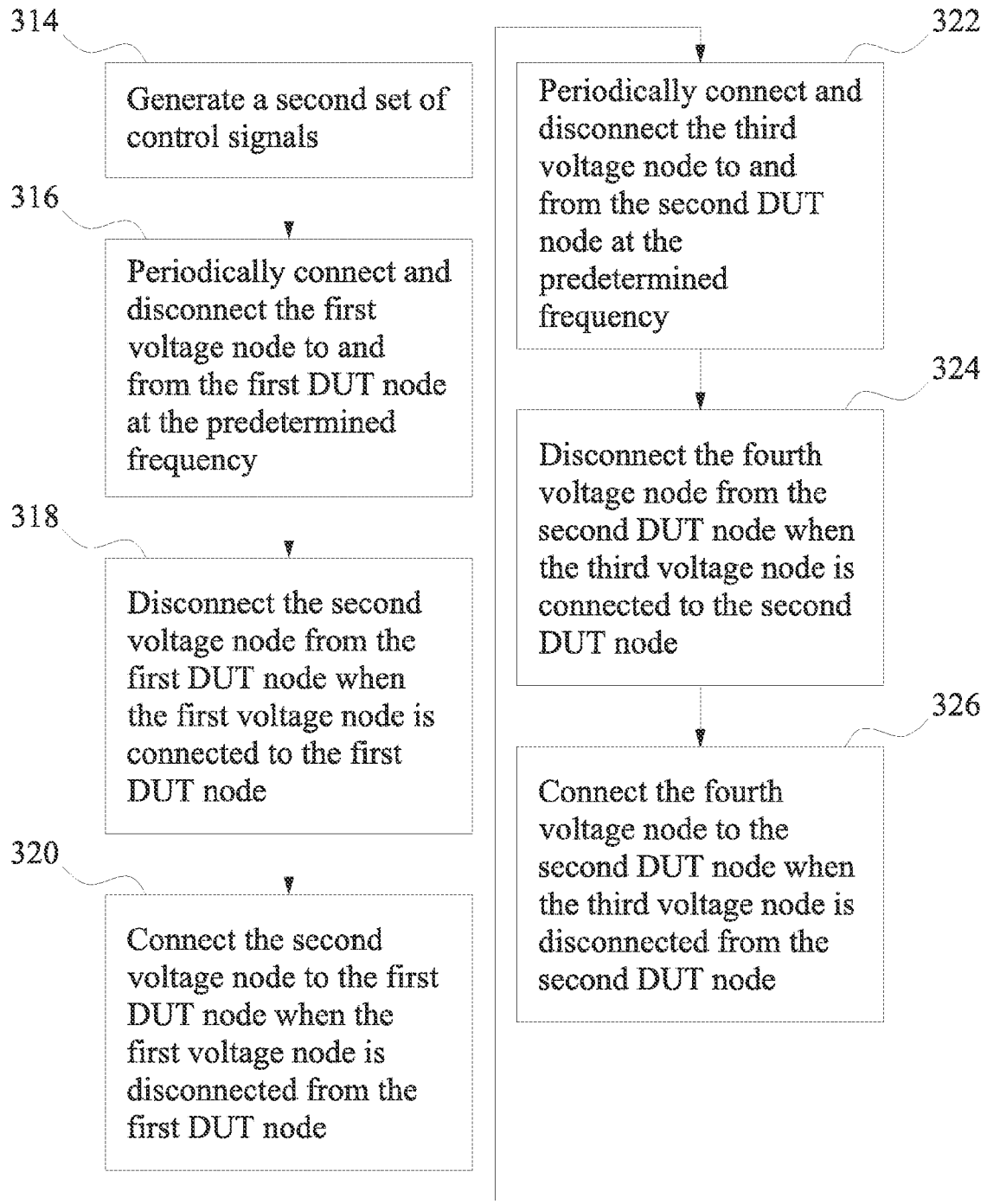

As illustrated in FIG. 3B, the circuit generates a second set of control signals (operation 314), and in response to the second set of control signals: the circuit periodically connects and disconnects the first voltage node to and from the first DUT node at the predetermined frequency (operation 316); the circuit disconnects the second voltage node from the first DUT node when the first voltage node is connected to the first DUT node (operation 318); the circuit connects the second voltage node to the first DUT node when the first voltage node is disconnected from the first DUT node (operation 320); the circuit periodically connects and disconnects the third voltage to and from the second DUT node at the predetermined frequency (operation 322); the circuit disconnects the fourth voltage node from the second DUT node when the third voltage node is connected to the second DUT node (operation 324); and the circuit connects the fourth voltage node to the second DUT node when the third voltage node is disconnected from the second DUT node (operation 326).

As illustrated in FIG. 3C, the circuit generates a third set of control signals (operation 328), and in response to the third set of control signals: the circuit disconnects the first voltage node from the first DUT node (operation 330); the circuit disconnects the second voltage node from the first DUT node (operation 332); the circuit disconnects the third voltage node from the second DUT node (operation 334); and the circuit disconnects the fourth voltage node from the second DUT node (operation 336).

As illustrated in FIG. 3D, the circuit generates a fourth set of control signals (operation 338), and in response to the fourth set of control signals: the circuit disconnects the third voltage node from the second DUT node (operation 340); the circuit connects the fourth voltage node to the second DUT node (operation 342); the circuit periodically connects and disconnects the first voltage node to and from the first DUT node at the predetermined frequency (operation 344); the circuit disconnects the second voltage node from the first DUT node when the first voltage node is connected to the first DUT node (operation 346); and the circuit connects the second voltage node to the first DUT node when the first voltage node is disconnected from the first DUT node (operation 348).

An exemplary method of measuring a capacitance of a DUT to be implemented using the circuit 100 of FIG. 1 will now be described according to the method of FIGS. 3A-3D with further reference to FIGS. 4A-4D. FIGS. 4A-4D are schematic diagrams illustrating operations of the circuit 100 in accordance with some embodiments. It is understood that additional operations may be performed before, during, and/or after the exemplary method and that some other processes may only be briefly described herein.

As illustrated in FIGS. 4A-4D, a DUT 410, e.g., a capacitor, is connected between the DUT nodes (A, B). A supply voltage (Vdd) is applied to the voltage nodes 110, 130 through the current-measuring unit 160. A ground voltage (Vss) is applied to the voltage nodes 120, 140. The DUT node (A) has a parasitic capacitance (Cp1) associated therewith. The DUT node (B) also has a parasitic capacitance (Cp2) associated therewith.

Figure 4B:
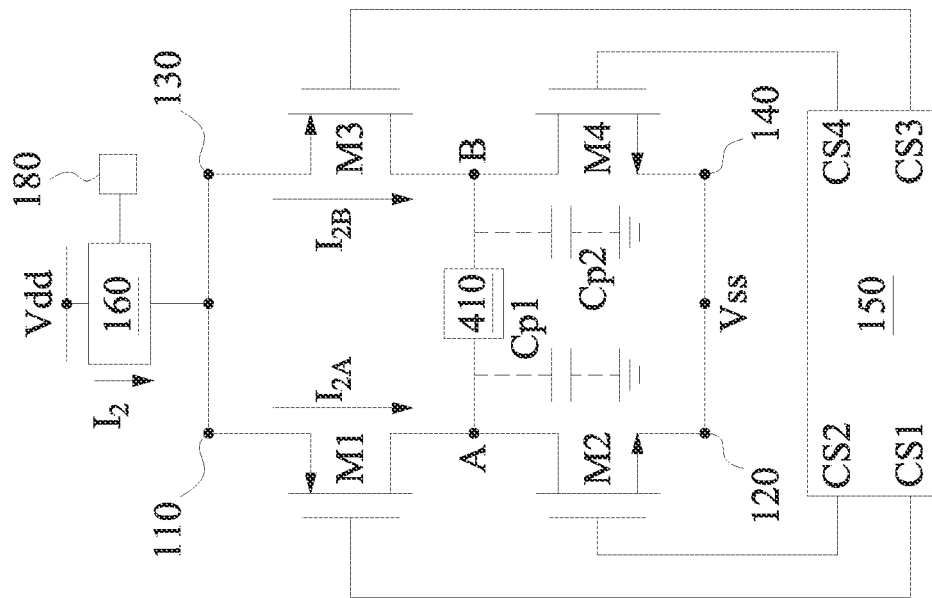
FIGS. 4A-4D are schematic diagrams illustrating operations of a circuit in accordance with some embodiments.
Figure 4A:
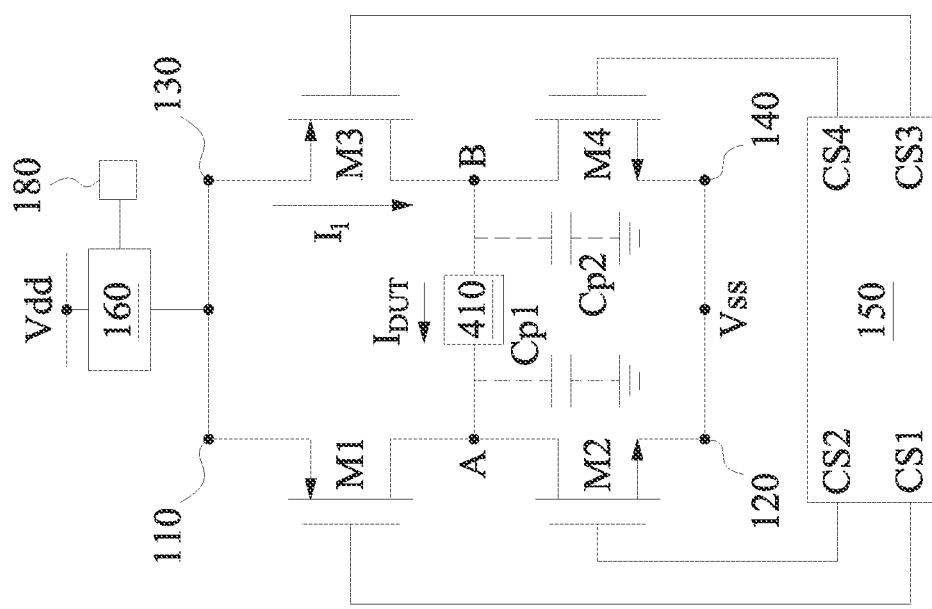

Referring to FIG. 4A, the control unit 150 generates a first set of control signals (CS1, CS2, CS3, CS4). At this time, the control signals (CS1, CS2) are high level signals and the control signals (CS3, CS4) are clock signals. In response to the first set of control signals (CS1, CS2, CS3, CS4): the transistor (M1) disconnects the voltage node 110 from the DUT node (A); the transistor (M2) connects the voltage node 120 to the DUT node (A); the transistor (M3) periodically connects and disconnects the voltage node 130 to and from the DUT node (B) at a predetermined frequency; the transistor (M4) disconnects the voltage node 140 from the DUT node (B) when the transistor (M3) connects the voltage node 130 to the DUT node (B), whereby a current ($I_1$) flows to the DUT node (B) through the current-measuring unit 160 and charges the DUT node (B) and a current ($I_{DUT}$) flows through the DUT 410 and charges the DUT 410; and the transistor (M4) connects the voltage node 140 to the DUT node (B) when the transistor (M3) disconnects the voltage node 130 from the DUT node (B), thereby discharging the DUT node (B) and the DUT 410.

Referring to FIG. 4B, the control unit 150 generates a second set of control signals (CS1, CS2, CS3, CS4). At this time, the control signals (CS1, CS2, CS3, CS4) are clock signals. In response to the second set of control signals (CS1, CS2, CS3, CS4): the transistor (M1) periodically connects and disconnects the voltage node 110 to and from the DUT node (A) at the predetermined frequency; the transistor (M2)

disconnects the voltage node 120 from the DUT node (A) when the transistor (M1) connects the voltage node 110 to the DUT node (A), whereby a current ($I_{2A}$) flows to the DUT node (A) and charges the DUT node (A); the transistor (M2) connects the voltage node 120 to the DUT node (A) when the transistor (M1) disconnects the voltage node 110 from the DUT node (A), thereby discharging the DUT node (A); the transistor (M3) periodically connects and disconnects the voltage node 130 to and from the DUT node (B) at the predetermined frequency; the transistor (M4) disconnects the voltage node 140 from the DUT node (B) when the transistor (M3) connects the voltage node 130 to the DUT node (B), whereby a current ($I_{2B}$) flows to the DUT node (B) and charges the DUT node (B) and a current (12) equal to the sum of currents ($I_{2A}$, $I_{2B}$) flows through the current-measuring unit 160; and the transistor (M4) connects the voltage node 140 to the DUT node (B) when the transistor (M3) disconnects the voltage node 130 from the DUT node (B), thereby discharging the DUT node (B).

Figure 4D:
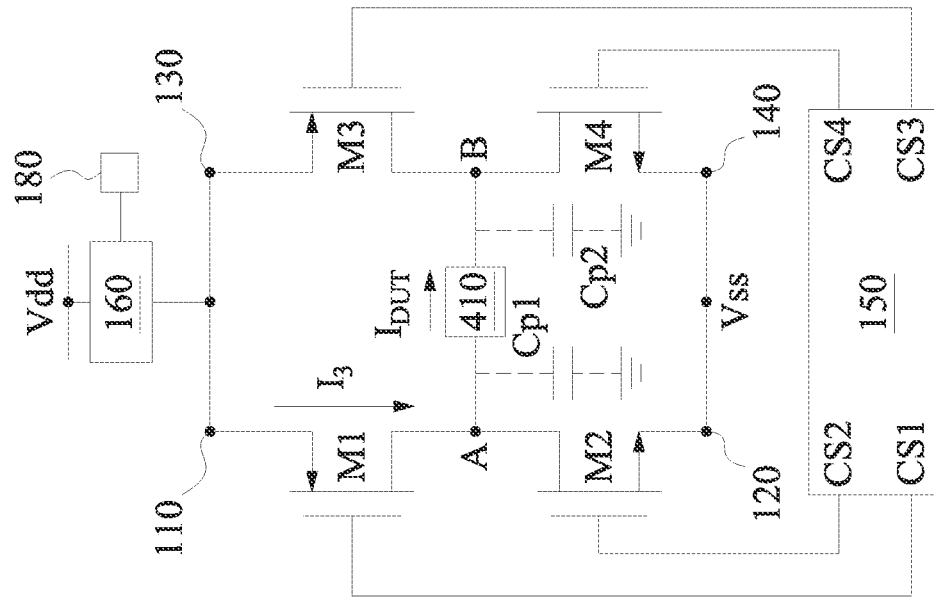
Figure 4C:
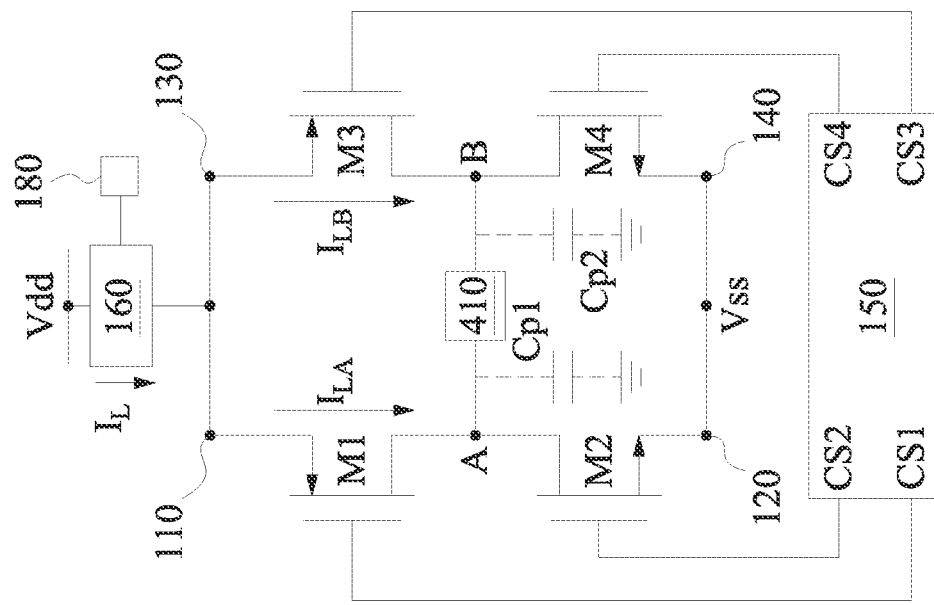

Referring to FIG. 4C, the control unit 150 generates a third set of control signals (CS1, CS2, CS3, CS4). At this time, the control signals (CS1, CS3) are high level signals and the control signals (CS2, CS4) are low level signals. In response to the third set of control signals (CS1, CS2, CS3, CS4): the transistor (M1) disconnects the voltage node 110 from the DUT node (A); the transistor (M2) disconnects the voltage node 120 from the DUT node (A); the transistor (M3) disconnects the voltage node 130 from the DUT node (B); and the transistor (M4) disconnects the voltage node 140 from the DUT node (B), whereby a current ($I_L$) equal to the sum of a leakage current ($I_{LA}$) flowing to the DUT node (A) and another leakage current ($I_{LB}$) flowing to the DUT node (B) flows through the current-measuring unit 160.

Referring to FIG. 4D, the control unit 150 generates a fourth set of control signals (CS1, CS2, CS3, CS4). At this time, the control signals (CS1, CS2) are clock signals and the control signals (CS3, CS4) are high level signals. In response to the fourth set of control signals (CS1, CS2, CS3, CS4): the transistor (M3) disconnects the voltage node 130 from the DUT node (B); the transistor (M4) connects the voltage node 140 to the DUT node (B); the transistor (M1) periodically connects and disconnects the voltage node 110 to and from the DUT node (A) at the predetermined frequency; the transistor (M2) disconnects the voltage node 120 from the DUT node (A) when the transistor (M1) connects the voltage node 110 to the DUT node (A), whereby a current ($I_3$) flows to the DUT node (A) through the current-measuring unit 160 and charges the DUT node (A) and a current ($I_{DUT}$) flows through the DUT 410 and charges the DUT 410; and the transistor (M2) connects the voltage node 120 to the DUT node (A) when the transistor (M1) disconnects the voltage node 110 from the DUT node (A), thereby discharging the DUT node (A) and the DUT 410.

Thereafter, the calculating unit 180 calculates the capacitance of the DUT 410 based on the currents ($I_1$, $I_2$, $I_3$, $I_L$), the predetermined frequency, and the supply voltage (Vdd).

In this exemplary embodiment, the current ($I_1$) is defined by the equation $$I_1 = (C_{p2} + C_{DUT}) \times Vdd \times f + I_L,$$

where f is the predetermined frequency and $C_{DUT}$ is the capacitance of the DUT 410.

The current ($I_2$) is defined by the equation $$I_2 = (C_{p1} + C_{p2}) \times Vdd \times f + I_L.$$

The current ($I_3$) is defined by the equation $$I_3 = (C_{p1} + C_{DUT}) \times Vdd \times f + I_L.$$

The calculating unit 180 calculates the capacitance of the DUT 410 as follows:

First, the calculating unit 180 calculates the current ($I_{DUT}$) based on the currents ($I_1$, $I_2$, $I_3$, $I_L$) using the equation $$I_{DUT} = I_1 + I_3 - I_2 - I_L.$$

Then, the calculating unit 180 calculates the capacitance ($C_{DUT}$) of the DUT 410 using the equation $$C_{DUT} = \frac{I_{DUT}}{Vdd \times f}.$$

Figure 5A:
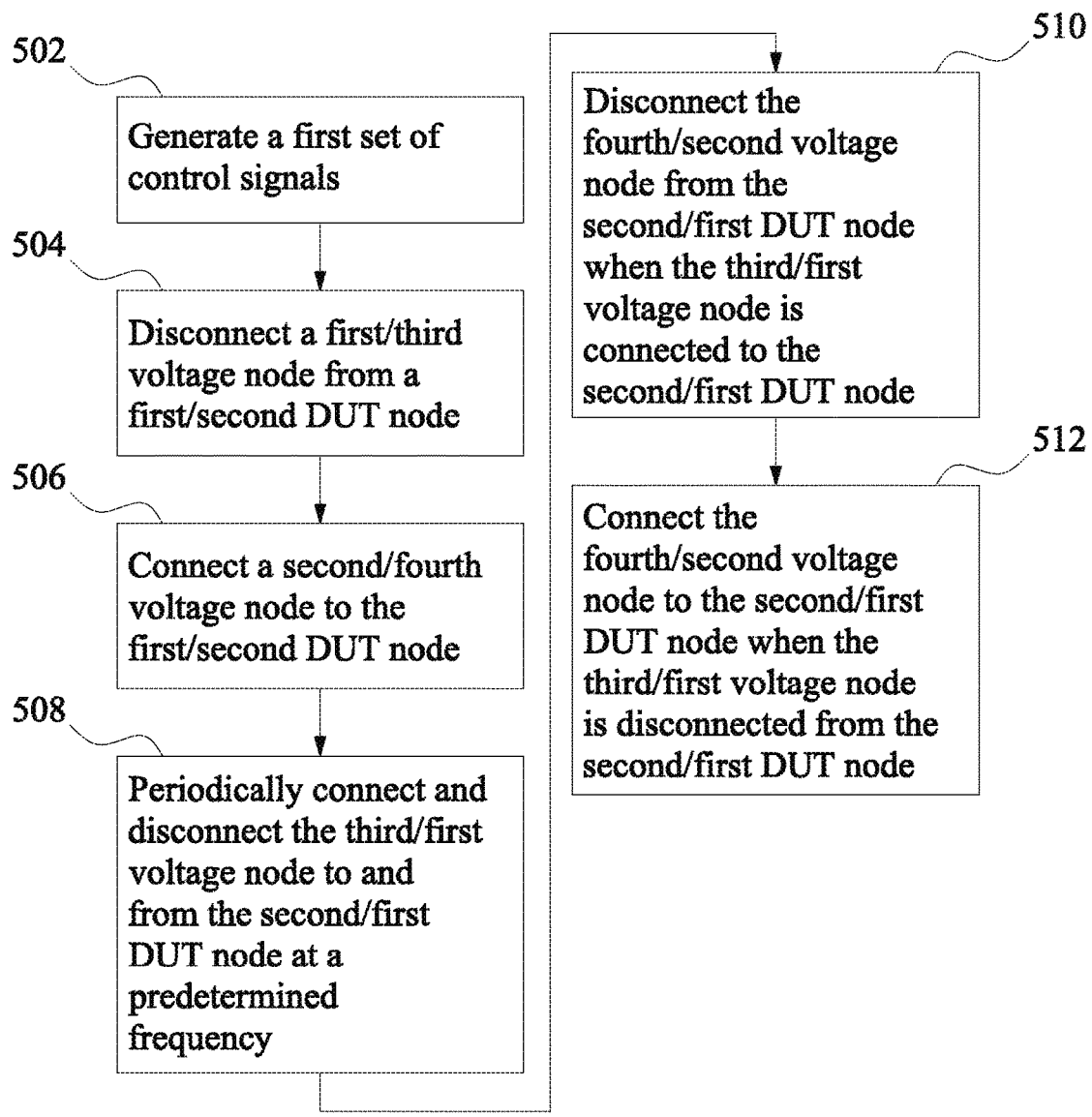
FIGS. 5A-5C are flowcharts of another exemplary method of testing a DUT in accordance with some embodiments.
Figure 5B:
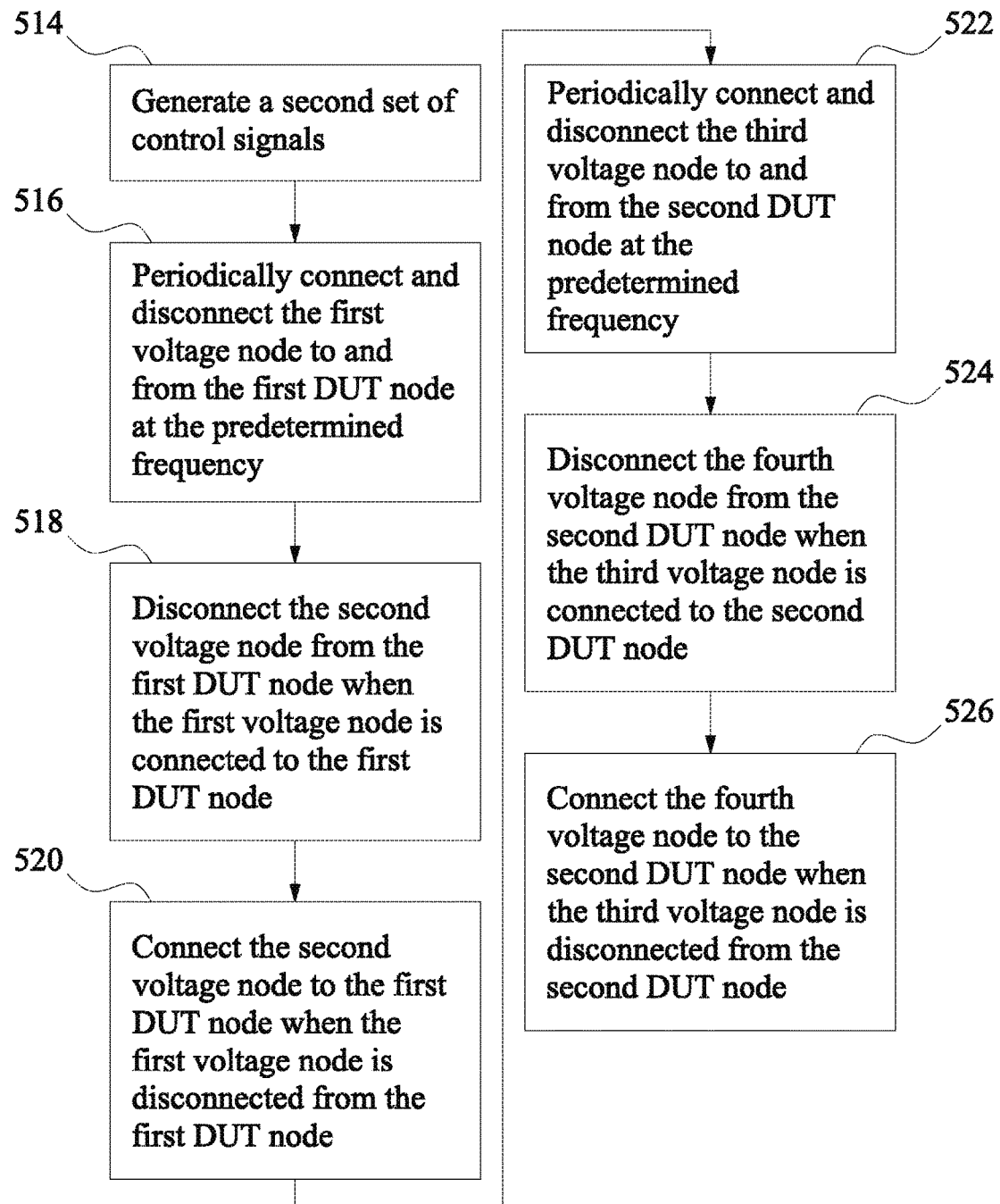
Figure 5C:
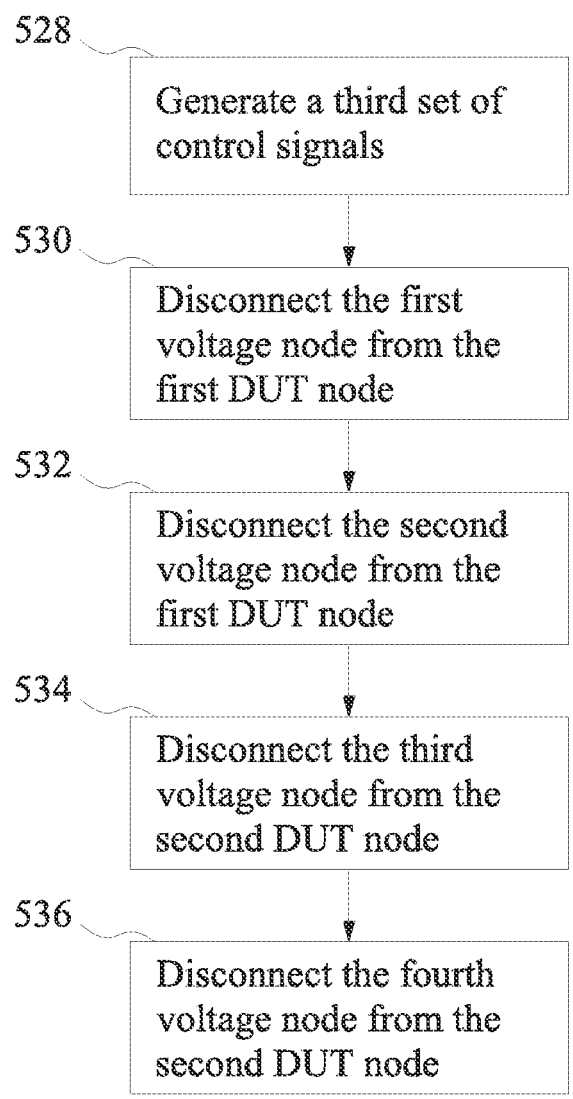

FIGS. 5A-5C are flowcharts of another exemplary method of testing a DUT connected between first and second DUT nodes in accordance with some embodiments. As illustrated in FIG. 5A, a circuit generates a first set of control signals (operation 502), and in response to the first set of control signals: the circuit disconnects a first/third voltage node from the first/second DUT node (operation 504); the circuit connects a second/fourth voltage node to the first/second DUT node (operation 506); the circuit periodically connects and disconnects the third/first voltage node to and from the second/first DUT node at a predetermined frequency (operation 508); the circuit disconnects the fourth/second voltage node from the second/first DUT node when the third/first voltage node is connected to the second/first DUT node (operation 510); and the circuit connects the fourth/second voltage node to the second/first DUT node when the third/first voltage node is disconnected from the second/first DUT node (operation 512).

As illustrated in FIG. 5B, the circuit generates a second set of control signals (operation 514, and in response to the second set of control signals: the circuit periodically connects and disconnects the first voltage node to and from the first DUT node at the predetermined frequency (operation 516); the circuit disconnects the second voltage node from the first DUT node when the first voltage node is connected to the first DUT node (operation 518); the circuit connects the second voltage node to the first DUT node when the first voltage node is disconnected from the first DUT node (operation 520); the circuit periodically connects and disconnects the third voltage node to and from the second DUT node at the predetermined frequency (operation 522); the circuit disconnects the fourth voltage node from the second DUT node when the third voltage node is connected to the second DUT node (operation 524); and the circuit connects the fourth voltage node to the second DUT node when the third voltage node is disconnected from the second DUT node (operation 526).

As illustrated in FIG. 5C, the circuit generates a third set of control signals (operation 528), and in response to the third set of control signals: the circuit disconnects the first voltage node from the first DUT node (operation 530); the circuit disconnects the second voltage node from the first DUT node (operation 532); the circuit disconnects the third voltage node from the second DUT node (operation 534); and the circuit disconnects the fourth voltage node from the second DUT node (operation 536).

Figure 6C:
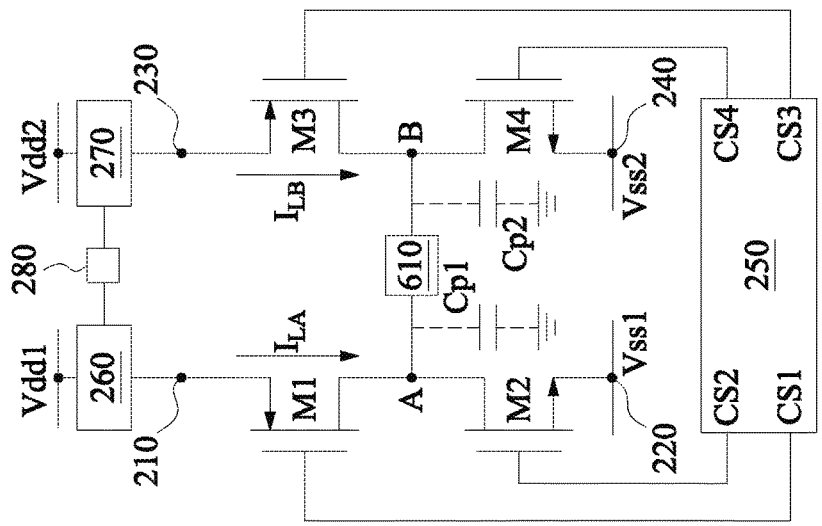
FIGS. 6A-6C are schematic diagrams illustrating operations of a circuit in accordance with some embodiments.
Figure 6B:
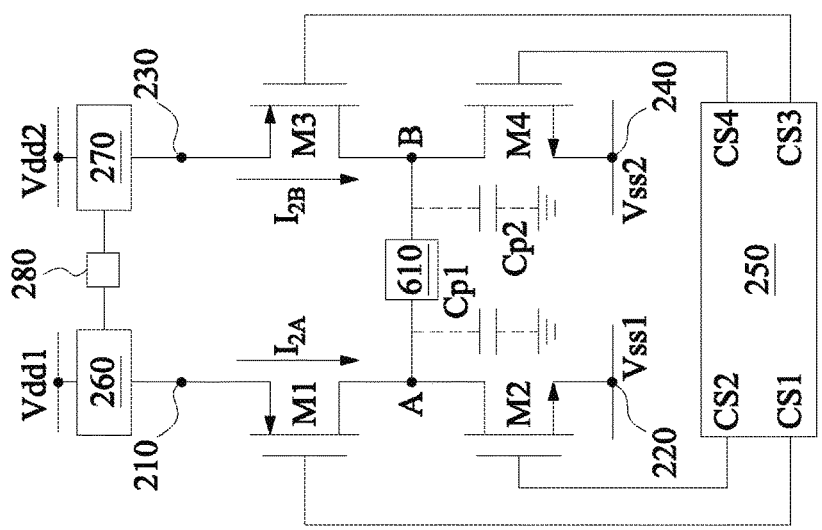
Figure 6A:
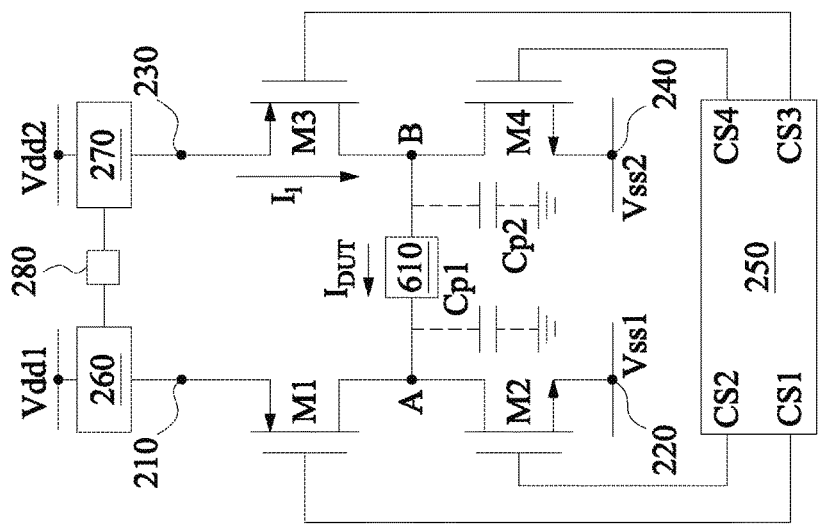

An exemplary method of measuring a capacitance of a DUT to be implemented using the circuit 200 of FIG. 2 will now be described according to the method of FIGS. 5A-5C with further reference to FIGS. 6A-6C. FIGS. 6A-6C are schematic diagrams illustrating operations of the circuit 200 in accordance with some embodiments. It is understood that additional operations may be performed before, during, and/or after the exemplary method and that some other processes may only be briefly described herein.

As illustrated in FIGS. 6A-6C, a DUT 610, e.g., a varactor or a metal-oxide-semiconductor capacitor (MOSCAP), is connected between the DUT nodes (A, B). A supply voltage (Vdd1) is applied to the voltage node 210 through the current-measuring unit 260. Another supply voltage (Vdd2) substantially equal to the supply voltage (Vdd1) is applied to the voltage node 230 through the current-measuring unit 270. A ground voltage (Vss1) is applied to the voltage node 220. Another ground voltage (Vss2) is applied to the voltage node 240. In an alternative exemplary embodiment, another supply voltage substantially equal to the supply voltage (Vdd1) is applied to the voltage node 220. The DUT node (A) has a parasitic capacitance (Cp1) associated therewith. The DUT node (B) also has a parasitic capacitance (Cp2) associated therewith.

Referring to FIG. 6A, the control unit 250 generates a first set of control signals (CS1, CS2, CS3, CS4). At this time, the control signals (CS1, CS2) are high level signals and the control signals (CS3, CS4) are clock signals. In response to the first set of control signals (CS1, CS2, CS3, CS4): the transistor (M1) disconnects the voltage node 210 from the DUT node (A); the transistor (M2) connects the voltage node 220 to the DUT node (A); the transistor (M3) periodically connects and disconnects the voltage node 230 to and from the DUT node (B) at a predetermined frequency; the transistor (M4) disconnects the voltage node 240 from the DUT node (B) when the transistor (M3) connects the voltage node 230 to the DUT node (B), whereby a current ($I_1$) flows to the DUT node (B) through the current-measuring unit 270 and charges the DUT node (B) and a current ($I_{DUT}$) flows through the DUT 610 and charges the DUT 610; and the transistor (M4) connects the voltage node 240 to the DUT node (B) when the transistor (M3) disconnects the voltage node 230 from the DUT node (B), thereby discharging the DUT node (B) and the DUT 610.

Referring to FIG. 6B, the control unit 250 generates a second set of control signals (CS1, CS2, CS3, CS4). At this time, the control signals (CS1, CS2, CS3, CS4) are clock signals. In response to the second set of control signals (CS1, CS2, CS3, CS4): the transistor (M1) periodically connects and disconnects the voltage node 210 to and from the DUT node (A) at the predetermined frequency; the transistor (M2) disconnects the voltage node 220 from the DUT node (A) when the transistor (M1) connects the voltage node 210 to the DUT node (A), whereby a current ($I_{2A}$) flows to the DUT node (A) through the current-measuring unit 260 and charges the DUT node (A); the transistor (M2) connects the voltage node 220 to the DUT node (A) when the transistor (M1) disconnects the voltage node 210 from the DUT node (A), thereby discharging the DUT node (A); the transistor (M3) periodically connects and disconnects the voltage node 230 to and from the DUT node (B) at the predetermined frequency; the transistor (M4) disconnects the voltage node 240 from the DUT node (B) when the transistor (M3) connects the voltage node 230 to the DUT node (B), whereby a current ($I_{2B}$) substantially equal to the current ($I_{2A}$) flows to the DUT node (B) through the current-measuring unit 270 and charges the DUT node (B); and the transistor (M4) connects the voltage node 240 to the DUT node (B) when the transistor (M3) disconnects the voltage node 230 from the DUT node (B), thereby discharging the DUT node (B).

Referring to FIG. 6C, the control unit 250 generates a third set of control signals (CS1, CS2, CS3, CS4). At this time, the control signals (CS1, CS3) are high level signals and the control signals (CS2, CS4) are low level signals. In response to the third set of control signals (CS1, CS2, CS3, CS4): the transistor (M1) disconnects the voltage node 210 from the DUT node (A); the transistor (M2) disconnects the voltage node 220 from the DUT node (A); the transistor (M3) disconnects the voltage node 230 from the DUT node (B); and the transistor (M4) disconnects the voltage node 240 from the DUT node (B), whereby a leakage current ($I_{LA}$) flows to the DUT node (A) through the current-measuring unit 260 and another leakage current ($I_{LB}$) substantially equal to the leakage current ($I_{LA}$) flows to the DUT node (B) through the current-measuring unit 270.

Thereafter, the calculating unit 280 calculates the capacitance of the DUT 610 based on the current ($I_1$), the current ($I_{2A}$) or the current ($I_{2B}$), the current ($I_{LA}$) or the current ($I_{LB}$), the predetermined frequency, and the supply voltage (Vdd1) or the supply voltage (Vdd2).

In this exemplary embodiment, the current ($I_1$) is defined by the equation $$I_1 = \int_0^{Vdd} [C_{DUT}(V) + C_{p2}]dV \times f + I_L,$$

where Vdd is the supply voltage (Vdd1) or the supply voltage (Vdd2), f is the predetermined frequency, $I_L$ is the current ($I_{LA}$) or the current ($I_{LB}$), and $C_{DUT}$ is the capacitance of the DUT 610.

The current ($I_{2A}$) is defined by the equation $$I_{2A} = \int_0^{Vdd} [C_{p1}(V)]dV \times f + I_L.$$

The current ($I_{2B}$) is defined by the equation $$I_{2B} = \int_0^{Vdd} [C_{p2}(V)]dV \times f + I_L.$$

The current ($I_{DUT}$) is defined by the equation $$I_{DUT} = \int_0^{Vdd} C_{DUT}(V)dV \times f.$$

The calculating unit 280 calculates the capacitance of the DUT 610 as follows:

First, the calculating unit 280 calculates a current ($I_{DUT1}$) that flows through the DUT 610 based on: the current ($I_1$) measured by the current-measuring unit 270 at Vdd+ΔV, where ΔV is, e.g., 0.02V; the current ($I_{2A}$) measured by the current-measuring unit 260 at Vdd+ΔV or the current ($I_{2B}$) measured by the current-measuring unit 270 at Vdd+ΔV; and the current ($I_{LA}$) measured by the current-measuring unit 260 at Vdd+ΔV or the current ($I_{LB}$) measured by the current-measuring unit 270 at Vdd+ΔV, using the equation $$I_{DUT1} = I_1 - I_2 - I_L,$$

where $I_2$ is the current ($I_{2A}$) or the current ($I_{2B}$).

Next, the calculating unit 280 calculates a current ($I_{DUT2}$) that flows through the DUT 610 based on: the current ($I_1$) measured by the current-measuring unit 270 at Vdd−ΔV, where ΔV is, e.g., 0.02V; the current ($I_{2A}$) measured by the current-measuring unit 260 at Vdd−ΔV or the current ($I_{2B}$) measured by the current-measuring unit 270 at Vdd−ΔV; and the current ($I_{LA}$) measured by the current-measuring unit 260 at Vdd−ΔV or the current ($I_{LB}$) measured by the current-measuring unit 270 at Vdd−ΔV, using the equation $$I_{DUT2} = I_1 - I_2 - I_L.$$

Then, the calculating unit 280 calculates the capacitance ($C_{DUT}$) of the DUT 610 using the equation $$C_{DUT} = \frac{I_{DUT1} - I_{DUT2}}{dV} \frac{1}{f}.$$

Figures 7A, 7B, 7C:
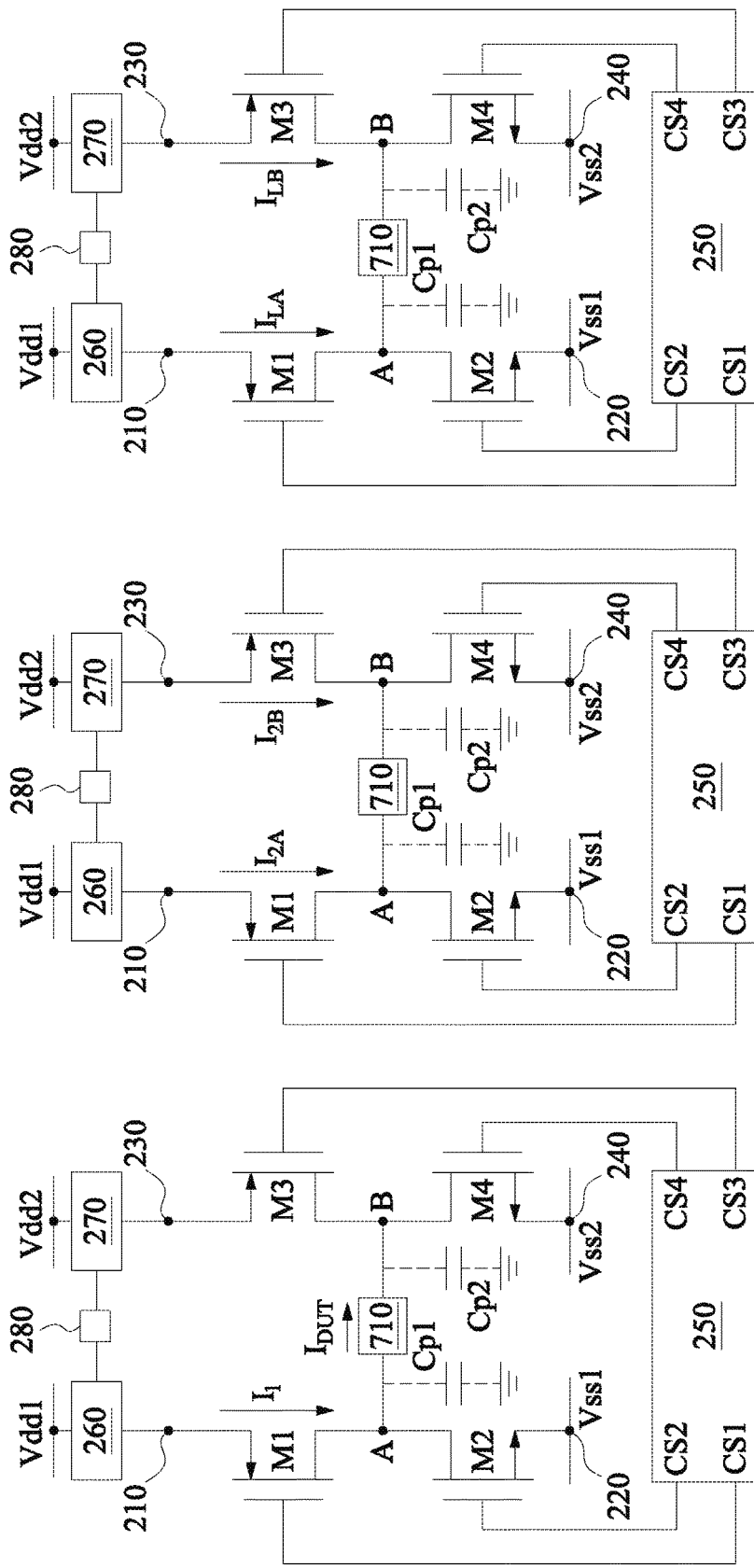
FIGS. 7A-7C are schematic diagrams illustrating operations of a circuit in accordance with some embodiments.

Another exemplary method of determining a capacitance of a DUT to be implemented using the circuit 200 of FIG. 2 will now be described according to the method of FIGS. 5A-5C with further reference to FIGS. 7A-7C. FIGS. 7A-7C are schematic diagrams illustrating operations of the circuit 200 in accordance with some embodiments. It is understood that additional operations may be performed before, during, and/or after the exemplary method and that some other processes may only be briefly described herein.

As illustrated in FIGS. 7A-7C, a DUT 710, e.g., a varactor or a MOSCAP, is connected between the DUT nodes (A, B). A supply voltage (Vdd1) is applied to the voltage node 210 through the current-measuring unit 260. Another supply voltage (Vdd2) substantially equal to the supply voltage (Vdd1) is applied to the voltage node 230 through the current-measuring unit 270. A ground voltage (Vss1) is applied to the voltage node 220. Another ground voltage (Vss2) is applied to the voltage node 240. In an alternative exemplary embodiment, another supply voltage substantially equal to the supply voltage (Vdd1) is applied to the voltage node 240. The DUT node (A) has a parasitic capacitance (Cp1) associated therewith. The DUT node (B) also has a parasitic capacitance (Cp2) associated therewith.

Referring to FIG. 7A, the control unit 250 generates a first set of control signals (CS1, CS2, CS3, CS4). At this time, the control signals (CS1, CS2) are clock signals and the control signals (CS3, CS4) are high level signals. In response to the first set of control signals (CS1, CS2, CS3, CS4): the transistor (M3) disconnects the voltage node 230 from the DUT node (B); the transistor (M4) connects the voltage node 240 to the DUT node (B); the transistor (M1) periodically connects and disconnects the voltage node 210 to and from the DUT node (A) at a predetermined frequency; the transistor (M2) disconnects the voltage node 220 from the DUT node (A) when the transistor (M1) connects the voltage node 210 to the DUT node (A), whereby a current ($I_1$) flows to the DUT node (A) through the current-measuring unit 260 and charges the DUT node (A) and a current ($I_{DUT}$) flows through the DUT 710 and charges the DUT 710; and the transistor (M2) connects the voltage node 220 to the DUT node (A) when the transistor (M1) disconnects the voltage node 210 from the DUT node (A), thereby discharging the DUT node (A) and the DUT 710.

Referring to FIG. 7B, the control unit 250 generates a second set of control signals (CS1, CS2, CS3, CS4). At this time, the control signals (CS1, CS2, CS3, CS4) are clock signals. In response to the second set of control signals (CS1, CS2, CS3, CS4): the transistor (M1) periodically connects and disconnects the voltage node 210 to and from the DUT node (A) at the predetermined frequency; the transistor (M2) disconnects the voltage node 220 from the DUT node (A) when the transistor (M1) connects the voltage node 210 to the DUT node (A), whereby a current ($I_{2A}$) flows to the DUT node (A) through the current-measuring unit 260 and charges the DUT node (A); the transistor (M2) connects the voltage node 220 to the DUT node (A) when the transistor (M1) disconnects the voltage node 210 from the DUT node (A), thereby discharging the DUT node (A); the transistor (M3) periodically connects and disconnects the voltage node 230 to and from the DUT node (B) at the predetermined frequency; the transistor (M4) disconnects the voltage node 240 from the DUT node (B) when the transistor (M3) connects the voltage node 230 to the DUT node (B), whereby a current ($I_{2B}$) substantially equal to the current ($I_{2A}$) flows to the DUT node (B) through the current-measuring unit 270 and charges the DUT node (B); and the transistor (M4) connects the voltage node 240 to the DUT node (B) when the transistor (M3) disconnects the voltage node 230 from the DUT node (B), thereby discharging the DUT node (B).

Referring to FIG. 7C, the control unit 250 generates a third set of control signals (CS1, CS2, CS3, CS4). At this time, the control signals (CS1, CS3) are high level signals and the control signals (CS2, CS4) are low level signals. In response to the third set of control signals (CS1, CS2, CS3, CS4): the transistor (M1) disconnects the voltage node 210 from the DUT node (A); the transistor (M2) disconnects the voltage node 220 from the DUT node (A); the transistor (M3) disconnects the voltage node 230 from the DUT node (B); and the transistor (M4) disconnects the voltage node 240 from the DUT node (B), whereby a leakage current ($I_{LA}$) flows to the DUT node (A) through the current-measuring unit 260 and another leakage current ($I_{LB}$) substantially equal to the leakage current ($I_{LA}$) flows to the DUT node (B) through the current-measuring unit 270.

Thereafter, the calculating unit 280 calculates the capacitance of the DUT 710 based on the current ($I_1$), the current ($I_{2A}$) or the current ($I_{2B}$), and the current ($I_{LA}$) or the current ($I_{LB}$), the predetermined frequency, and the supply voltage (Vdd1) or the supply voltage (Vdd2).

In this exemplary embodiment, the current ($I_1$) is defined by the equation $$I_1 = \int_0^{Vdd} [C_{DUT}(V) + C_{p2}] dV \times f + I_L,$$

where Vdd is the supply voltage (Vdd1) or the supply voltage (Vdd2), f is the predetermined frequency, $I_L$ is the current ($I_{LA}$) or the current ($I_{LB}$), and $C_{DUT}$ is the capacitance of the DUT 710.

The current ($I_{2A}$) is defined by the equation $$I_{2A} = \int_0^{Vdd} [C_{p1}(V)] dV \times f + I_L.$$

The current ($I_{2B}$) is defined by the equation $$I_{2B} = \int_0^{Vdd} [C_{p2}(V)] dV \times f + I_L.$$

The current ($I_{DUT}$) is defined by the equation $$I_{DUT} = \int_0^{Vdd} C_{DUT}(V)\,dV \times f.$$

The calculating unit 280 calculates the capacitance of the DUT 710 as follows:

First, the calculating unit 280 calculates a current ($I_{DUT1}$) that flows through the DUT 710 based on: the current ($I_1$) measured by the current-measuring unit 260 at Vdd+ΔV, where ΔV is, e.g., 0.02V; the current ($I_{2A}$) measured by the current-measuring unit 260 at Vdd+ΔV or the current ($I_{2B}$) measured by the current-measuring unit 270 at Vdd+ΔV; and the current ($I_{LA}$) measured by the current-measuring unit 260 at Vdd+ΔV or the current ($I_{LB}$) measured by the current-measuring unit 270 at Vdd+ΔV, using the equation $$I_{DUT1} = I_1 - I_2 - I_L,$$

where $I_2$ is the current ($I_{2A}$) or the current ($I_m$).

Next, the calculating unit 280 calculates a current ($I_{DUT2}$) that flows through the DUT 710 based on: the current ($I_1$) measured by the current-measuring unit 260 at Vdd−ΔV, where ΔV is, e.g., 0.02V; the current ($I_{2A}$) measured by the current-measuring unit 260 at Vdd−ΔV or the current ($I_{2B}$) measured by the current-measuring unit 270 at Vdd−ΔV; and the current ($I_{LA}$) measured by the current-measuring unit 260 at Vdd−ΔV or the current ($I_{LB}$) measured by the current-measuring unit 270 at Vdd−ΔV, using the equation $$I_{DUT2} = I_1 - I_2 - I_L.$$

Then, the calculating unit 280 calculates the capacitance ($C_{DUT}$) of the DUT 710 using the equation $$C_{DUT} = \frac{I_{DUT1} - I_{DUT2}}{dV} \frac{1}{f}.$$

Figure 8:
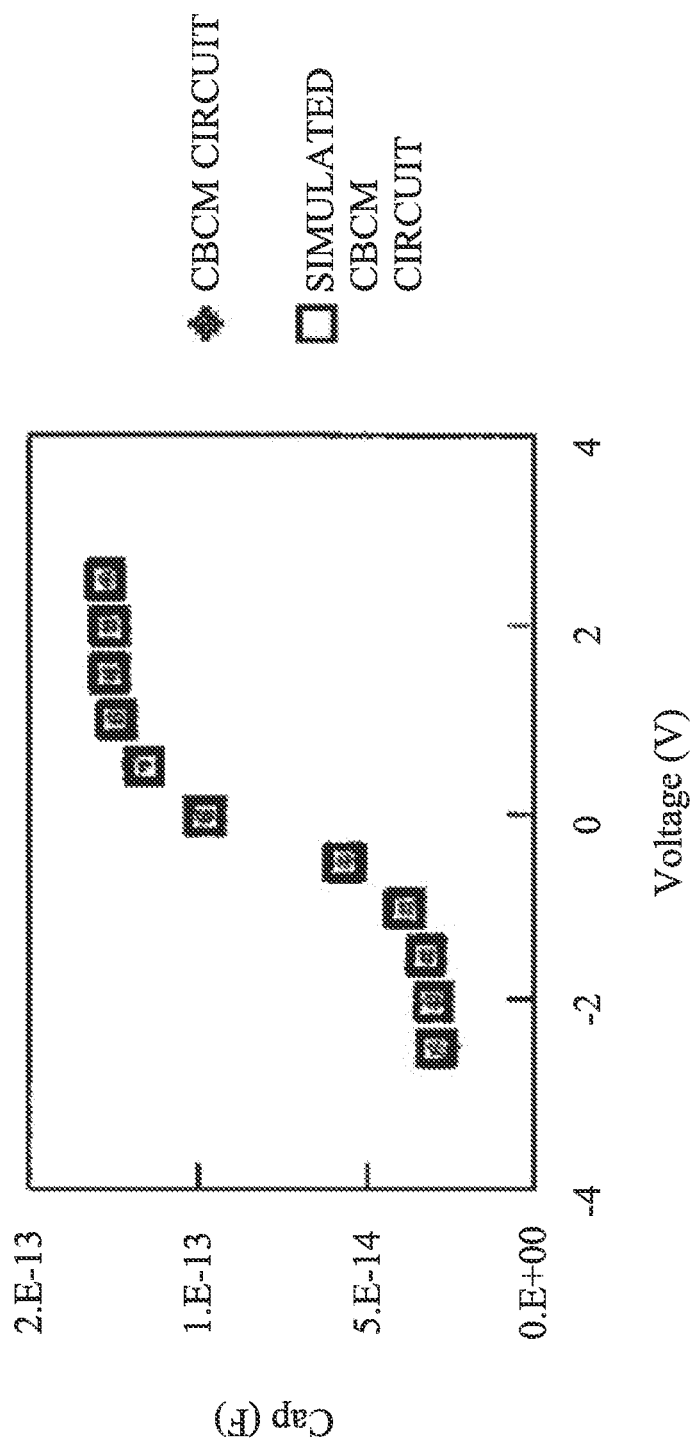
FIG. 8 is a plot illustrating capacitance vs. voltage in accordance with some embodiments.

From experimental results, the CBCM circuit of the present disclosure accurately measures relatively small capacitances that vary with voltage. For example, FIG. 8 is a plot illustrating capacitance vs. voltage in accordance with some embodiments. As illustrated in FIG. 8, the capacitances of a MOSCAP measured at different voltages by the CBCM circuit, e.g., the circuit 200, of the present disclosure coincide with those measured by a CBCM circuit simulated by a simulation software, such as a Simulation Program with Integrated Circuit Emphasis (SPICE).

In an exemplary embodiment of a circuit for testing a device under test (DUT), the circuit comprises first and second DUT nodes, first and second voltage nodes, first and second transistors, and a control unit. The first and second DUT nodes are connected to the DUT. The first and second voltage nodes are connected to each other. The first transistor includes a first terminal connected to the first voltage node, a second terminal connected to the first DUT node, and a third terminal. The second transistor includes a first terminal connected to the second voltage node, a second terminal connected to the second DUT node, and a third terminal free from connection with the third terminal of the first transistor. The control unit includes a pair of ports, each of which is connected to the third terminal of a respective one of the first and second transistors, and is configured to control operations of the first and second transistors.

In another exemplary embodiment of a circuit for testing a device under test (DUT), the circuit comprises first and second DUT nodes, first and second voltage nodes, first and second transistors, and a control unit. The DUT nodes are connected to the DUT. The first and second voltage nodes are free from connection with each other. The first transistor includes a first terminal connected to the first voltage node, a second terminal connected to the first DUT node, and a third terminal. The second transistor includes a first terminal connected to the second voltage node, a second terminal connected to the second DUT node, and a third terminal free from connection with the third terminal of the first transistor. The control unit includes a pair of ports, each of which is connected to the third terminal of a respective one of the first and second transistors, and is configured to control operations of the first and second transistors.

In an exemplary embodiment of a method of testing a device under test (DUT) connected between first and second DUT nodes, the method comprises: generating a set of control signals; and in response to the set of control signals: disconnecting a first voltage node from the first DUT node; connecting a second voltage node to the first DUT nodel; periodically connecting and disconnecting a third voltage node to and from the second DUT node at a predetermined frequency; disconnecting a fourth voltage node from the second DUT node when the third voltage node is connected to the second DUT node; and connecting the fourth voltage node to the second DUT node when the third voltage node is disconnected from the second DUT node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for testing a device under test (DUT), the circuit comprising:
    first and second DUT nodes, configured for the DUT to be connected from the first DUT node to the second DUT node;
    a first transistor configured to, when activated, conduct electricity from a first voltage node to the first DUT node;
    a second transistor configured to, when activated, conduct electricity from a second voltage node to the second DUT node;
    a third transistor configured to, when activated, conduct electricity from the first DUT node to a third voltage node;
    a fourth transistor configured to, when activated, conduct electricity from the second DUT node to a fourth voltage node;
    a control unit configured to control activation of each of the first, second, third, and fourth transistors independently to provide different transistor-activation conditions; and
    a calculating unit configured to calculate a capacitance of the DUT based on different measurements of current flow in the circuit during the different transistor-activation conditions.

2. The circuit of claim 1, further comprising:
a current measuring unit configured to take the measurements of current flow in the circuit during the different transistor-activation conditions.

3. The circuit of claim 2, wherein the first and second voltage nodes are connected together and connected through the current measuring unit to a common supply voltage.

4. The circuit of claim 2, wherein the current measuring unit includes (i) a first current measuring device that conducts a first supply current to the first voltage node and (ii) a second current measuring device that conducts a second supply current to the second voltage node.

5. The circuit of claim 2, wherein the third and fourth voltage nodes are connected to a common ground voltage.

6. The circuit of claim 2, wherein the third voltage node is connected to a first ground voltage, and the fourth voltage node is connected to a second ground voltage different than the first ground voltage.

7. The circuit of claim 2, wherein the DUT is a capacitor that is connected from the first DUT node to the second DUT node.

8. The circuit of claim 7, wherein the capacitor is formed in wafer fabrication.

9. A method of testing a device under test (DUT) connected between first and second DUT nodes, the method comprising:
generating a first set of control signals; and
in response to the first set of control signals:
disconnecting a first voltage node from the first DUT node;
connecting a second voltage node to the first DUT node;
periodically connecting and disconnecting a third voltage node to and from the second DUT node at a predetermined frequency;
disconnecting a fourth voltage node from the second DUT node when the third voltage node is connected to the second DUT node; and
connecting the fourth voltage node to the second DUT node when the third voltage node is disconnected from the second DUT node;
in response to the first set of control signals, measuring a first current that flows to one of the first and second DUT nodes;
generating a fourth set of control signals; and
in response to the fourth set of control signals:
disconnecting the third voltage node from the second DUT node;
connecting the fourth voltage node to the second DUT node;
periodically connecting and disconnecting the first voltage node to and from the first DUT node at the predetermined frequency;
disconnecting the second voltage node from the first DUT node when the first voltage node is connected to the first DUT node; and
connecting the second voltage node to the first DUT node when the first voltage node is disconnected from the first DUT node;
wherein each connecting is by activating a transistor and each disconnecting is by deactivating a transistor.

10. The method of claim 9, further comprising:
generating a second set of control signals; and
in response to the second set of control signals:
periodically connecting and disconnecting the first voltage node to and from the first DUT node at the predetermined frequency;
disconnecting the second voltage node from the first DUT node when the first voltage node is connected to the first DUT node;
connecting the second voltage node to the first DUT node when the first voltage node is disconnected from the first DUT node;
periodically connecting and disconnecting the third voltage node to and from the second DUT node at the predetermined frequency;
disconnecting the fourth voltage node from the second DUT node when the third voltage node is connected to the second DUT node; and
connecting the fourth voltage node to the second DUT node when the third voltage node is disconnected from the second DUT node; and
generating a third set of control signals; and
in response to the third set of control signals:
disconnecting the first voltage node from the first DUT node;
disconnecting the third voltage node from the second DUT node;
disconnecting the second voltage node from the first DUT node; and
disconnecting the fourth voltage node from the second DUT node.

11. A method of testing a device under test (DUT), the method comprising:
providing a first transistor that, when activated, conducts electricity from a first voltage node to a first DUT node;
providing a second transistor that, when activated, conducts electricity from a second voltage node to a second DUT node;
providing a third transistor that, when activated, conducts electricity from the first DUT node to a third voltage node;
providing a fourth transistor that, when activated, conducts electricity from the second DUT node to a fourth voltage node;
connecting the DUT from the first DUT node to the second DUT node;
testing a device under test (DUT) from the first DUT node to the second DUT node;
controlling-activation of each of the first, second, third, and fourth transistors independently to provide different transistor-activation conditions; and
calculating a capacitance of the DUT based on different measurements of current flow in the circuit taken during the different transistor-activation conditions.

12. The method of claim 11, further comprising:
taking the measurements of current flow in the circuit during the different transistor-activation conditions.

13. The method of claim 12, wherein when the measurements are taken, the first and second voltage nodes are connected together and connected through the current measuring unit to a common supply voltage.

14. The method of claim 12, wherein the measurements include measurements of (i) a first supply current conducted to the first voltage node and (ii) a different second supply current conducted to the second voltage node.

15. The method of claim 12, wherein the third and fourth voltage nodes are connected to a common ground voltage.

16. The method of claim 12, wherein the third voltage node is connected to a first ground voltage, and the fourth voltage node is connected to a second ground voltage different than the first ground voltage.

17. The method of claim 12, wherein the DUT is a capacitor.

18. The method of claim 11, wherein the different transistor-activation conditions include a condition of:
  deactivating the first transistor,
  activating the third transistor, and
  alternating between (i) activating the second transistor and deactivating the fourth transistor and (ii) deactivating the second transistor and activating the fourth transistor.

19. The method of claim 18, wherein the different transistor-activation conditions include a condition of:
  deactivating the second transistor,
  activating the fourth transistor, and
  alternating between (i) activating the first transistor and deactivating the third transistor and (ii) deactivating the first transistor and activating the third transistor.

20. The method of claim 18, wherein the different transistor-activation conditions include a condition of:
  alternating between (i) activating the first transistor and deactivating the third transistor and (ii) deactivating the first transistor and activating the third transistor, and
  alternating between (i) activating the second transistor and deactivating the fourth transistor and (ii) deactivating the second transistor and activating the fourth transistor; and
  wherein the different transistor-activation conditions further include a condition in which each of the first, second, third and fourth transistors is deactivated.

* * * * *